(12) United States Patent
Kuzmenka

(10) Patent No.: US 7,271,472 B2
(45) Date of Patent: Sep. 18, 2007

(54) CIRCUIT BOARD AND METHOD FOR PRODUCING A CIRCUIT BOARD

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 10/928,616

(22) Filed: Aug. 27, 2004

(65) Prior Publication Data

US 2006/0043547 A1    Mar. 2, 2006

(51) Int. Cl.
*H01L 23/02*    (2006.01)
(52) U.S. Cl. .............. 257/678; 257/698; 257/691; 257/621; 257/676; 257/700; 257/735
(58) Field of Classification Search ............ 257/678, 257/698, 691, 621, 676, 700, 735
See application file for complete search history.

(56) References Cited

U.S. PATENT DOCUMENTS

| | | | | |
|---|---|---|---|---|
| 5,912,597 A | * | 6/1999 | Inagawa et al. | 333/1 |
| 6,184,477 B1 | * | 2/2001 | Tanahashi | 174/261 |
| 6,184,478 B1 | * | 2/2001 | Imano et al. | 174/261 |
| 6,483,714 B1 | * | 11/2002 | Kabumoto et al. | 174/261 |
| 2005/0269599 A1 | * | 12/2005 | Huang et al. | 257/205 |

* cited by examiner

*Primary Examiner*—Sara Crane
*Assistant Examiner*—Junghwa Im
(74) *Attorney, Agent, or Firm*—Slater & Matsil, L.L.P.

(57) ABSTRACT

A circuit board comprises a dielectric layer, a net of first power supply lines for providing a first reference voltage plane and a net of second power supply lines for providing a second reference voltage plane. The nets of first and second power supply lines are arranged such that first power supply lines and second power supply lines are alternately arranged in the direction of a first surface of the dielectric layer.

9 Claims, 2 Drawing Sheets

US 7,271,472 B2

1

CIRCUIT BOARD AND METHOD FOR PRODUCING A CIRCUIT BOARD

BACKGROUND OF THE INVENTION

1. Field of the Invention

The present invention refers to circuit boards and methods for producing a circuit board, and in particular to circuit boards comprising a plurality of reference voltage planes.

2. Description of the Prior Art

Printed circuit boards usually comprise a plurality of signal layers and reference voltage layers. Most modern printed circuit boards and especially circuit boards operating with high frequency signals contain one or more supply or reference planes like supply voltage VDD-planes, ground GND-planes or reference voltage Vref-planes. The reference planes are typically copper planes. Most of the signal traces on printed circuit boards are referenced to one of the reference planes. This allows a better controlled impedance of the signal traces and less mutual coupling between neighboring signal traces. A return current of high frequency signals usually propagates on the reference plane in the region directly under the signal trace.

For example in DIMM memory modules (DIMM; DIMM=Dual In Line Memory Module) or in mother boards, there are normally some signal groups which are referenced to a particular reference plane. For example, data bus and clock signal lines are referenced to the GND-plane along the whole path of a memory controller to the memory DRAM chip of the memory module. Contrary thereto, command-address bus lines are referenced to the VDD-plane.

FIG. 4 shows a cross-sectional view of a conventional four-layer circuit board. The circuit board comprises a first, a second and a third dielectric layer 402, 404, 406. A first surface of the dielectric layer 402, in FIG. 4 the top surface, forms a signal layer with a first signal trace 412. A first surface of the second dielectric layer 404, in FIG. 4 the bottom surface, forms a further signal layer comprising a second signal trace 414. The signal traces 412, 414 are strip line or micro-strip lines which are referenced to the supply planes 424, 426. A first supply plane 424 is arranged between the first dielectric layer 402 and the third dielectric layer 406. The second supply plane 426 is arranged between the second dielectric layer 404 and the third dielectric layer 406. Here, the first supply plane 424 forms a GND-plane and the second supply plane 426 forms a VDD-plane. The circuit board comprises a via 442 which connects the first signal trace 412 with the second signal trace 414.

The first signal trace 412 is routed next to and in parallel to the first supply plane 424. Therefore, a return current of a signal propagating on the first signal trace 412 returns on the first supply plane 424. The second signal trace 414 is routed opposite the second supply plane 426. Therefore, a return current of a signal propagating on the second signal trace 414 returns on the second supply plane 426. This is a disadvantage for a signal propagating from the first signal trace 412 through the via 442 to the second signal trace 414 because the first signal trace 412 is referenced to a different supply plane than the second signal trace 414. Here, a signal trace 412, 414 jumps from the signal layer on the top surface of the first dielectric layer 402 through the via 442 to the second signal layer on the bottom surface of the second dielectric layer 404. This results in a change of the reference plane from the ground-plane 424 to the VDD-plane 426. Thus, the current return path for a signal propagating on the combined traces 412, 414 is broken. Such an interruption in the current return path results in signal reflections because of

2 a non-monotonic impedance of the trace and trace-to-trace crosstalk in a region where current return paths of different traces share the same area of the copper plane. Such effect is not so large on traces without vias because the high frequency return current propagates directly behind the trace, but takes place in a region where vias are located. The disadvantage of signal reflections is a bad signal quality which limits the maximum frequency of a signal. Trace-to-trace crosstalk in the via region makes a limitation of via-to-via spacing necessary and restricts the number of vias per trace, which makes a board layout more difficult or even impossible.

The number of signal layers or routing layers is limited. Normally there are just two routing layers per reference plane. Therefore, it is difficult to perform a signal routing which keeps referencing the signal traces to only the required reference plane without changing to another reference plane. In order to keep referencing to the required plane, a large number of layers is necessary which makes the thickness of the printed circuit board unacceptably large.

SUMMARY OF THE INVENTION

It is the object of the present invention to provide a circuit board with improved reference voltages and a method for producing such a circuit board.

In accordance with a first aspect, the present invention provides a circuit board, comprising: a dielectric layer; a net of first power supply lines for providing a first reference voltage plane; and a net of second power supply lines for providing a second reference voltage plane; wherein the nets of first and second power supply lines are arranged such that first power supply lines and second power supply lines are alternately arranged in the direction of a first surface of the dielectric layer.

In accordance with a second aspect, the present invention provides a method for producing a circuit board, comprising the steps of: providing a dielectric layer; providing a net of first power supply lines for providing a first reference voltage plane and providing a net of second power supply lines for providing a second reference voltage plane; and arranging the nets of first and second power supply lines such that first power supply lines and second power supply lines are alternately arranged in the direction of a first surface of the dielectric layer.

The present invention is based on the finding that a conducting plane which combines for example a VDD reference and a GND reference in one layer allows routing a signal trace on different signal layers without the problem of a broken signal current return path. The proposed kind of supply reference plane allows an uninterrupted current return path for strip and micro-strip printed circuit boards transmission lines routed on different signal layers of the printed circuit board. The uninterrupted current return path is achieved without increasing the thickness of the circuit board, as there are no additional signal planes or reference voltage planes necessary. Moreover, the thickness of a circuit board is reduced due to the combined reference plane which combines two separate reference layers. Thus, the proposed kind of supply/reference plane provides the advantage of less board thickness. A further advantage is a much higher capacitive coupling between VDD and GND which is due to the very tight spacing between the VDD-supply lines and the GND-supply lines of the combined reference layer.

According to a further aspect of the present invention, a combined reference plane is realized by woven copper wires wherein each second wire in a horizontal and a vertical dimension is a GND-wire and the other woven wires are VDD-wires. Wires belonging to the same supply voltage are connected, while wires belonging to different supply voltages are isolated from each other.

Such a woven net of wires belonging to different reference voltages allows signals to be routed in any direction substantially in parallel to the combined reference layer.

According to a further aspect, the wires of different reference voltages are isolated by a coating of varnish. This has the advantage that no isolating layer is necessary between wires of different supply voltages. Further, varnishes with different melting temperatures can be used. This allows providing an electric connection between wires belonging to the same supply voltage for example by heating the wires to the temperature at which the first varnish is melting and afterwards chemically fixing the first varnish and heating the wires belonging to the second reference voltage to the temperature at which the second varnish is melting.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the following description of the preferred embodiments of the present invention same or similar reference numbers are used for similar elements shown in different figures, wherein a repeated description of these elements is omitted.

Figure 1:
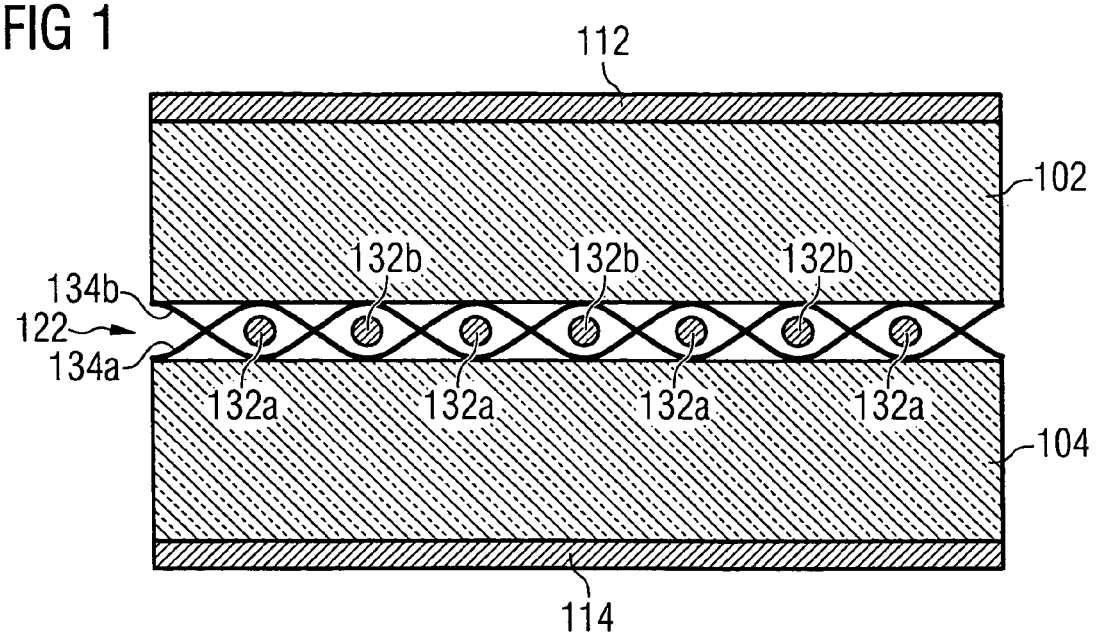
FIG. 1 is a cross-sectional view of a circuit board according to an embodiment of the present invention.

FIG. 1 shows a side view of a section of a circuit board with a woven plane according to an embodiment of the present invention.

The circuit board comprises a first dielectric layer 102 and a second dielectric layer 104. On a first surface of the first dielectric layer 102, in FIG. 1 the top surface, a signal trace 112 is arranged. On a first surface of the second dielectric layer 104, in FIG. 1 the bottom surface, a second signal trace 114 is arranged. The top surface of the first dielectric layer 102 and the bottom surface of the second dielectric layer 104 form signal layers of the circuit board. The signal traces 112, 114 can be realized as strip lines or micro-strip lines.

A woven GND/VDD plane 122 is arranged between the second surfaces of the dielectric layers 102, 104. The second surfaces are opposite the first surfaces of the dielectric layers 102, 104. The woven plane 122 forms a combined reference voltage plane, providing a first reference plane for the first signal trace 112 arranged on the top surface of the first dielectric layer 102 and a second reference voltage plane for the second signal trace 114 arranged on the bottom surface of the second dielectric layer 104. A signal return current for both traces 112 and 114 will propagate through the woven plane 122 like it would be a solid conductive plane. A grid of GND and VDD wires will act for the AC return current like a one conducting plane where equal portions of current will be divided in between wires belonging DC-wise to different nets –GND and VDD. In the embodiment shown in FIG. 1, the wires 132a, 132b, 134a, 134b are arranged in an interwoven configuration.

In this embodiment, the top surface and the bottom surface of the dielectric layers 102, 104 are arranged horizontally. The combined reference plane 122 is arranged in the same horizontal orientation as the top and bottom surfaces of the dielectric layers 102, 104. Adjacent wires 132a, 132b of the woven plane 122 belong to different reference voltages. Thus, a ground wire 132a is arranged between two VDD-wires 132b. The wires 132a, 132b are orientated in a first major orientation parallel to the top surface and the bottom surface of the dielectric layers 102, 104. The wires 134a, 134b are arranged in a second major direction, being orthogonal to the first major direction and being parallel to the top surface and the bottom surface of the first and second dielectric layers 102, 104.

Due to the interwoven structure of the combined reference plane 122, a mean distance between the surface of the first dielectric layer 102 and the GND-wires 132a, 134a and the VDD-wires 132b, 134b is equal. Therefore, the GND-wires 132a, 134a forming a GND reference plane as well as the VDD-wires 132b, 134b forming a VDD reference plane could form a reference voltage plane for the first signal trace 112. Therefore, dependent on the kind of signals propagating on the first signal trace 112 a signal return current could flow on the VDD reference plane or the GND reference plane.

Figure 2:
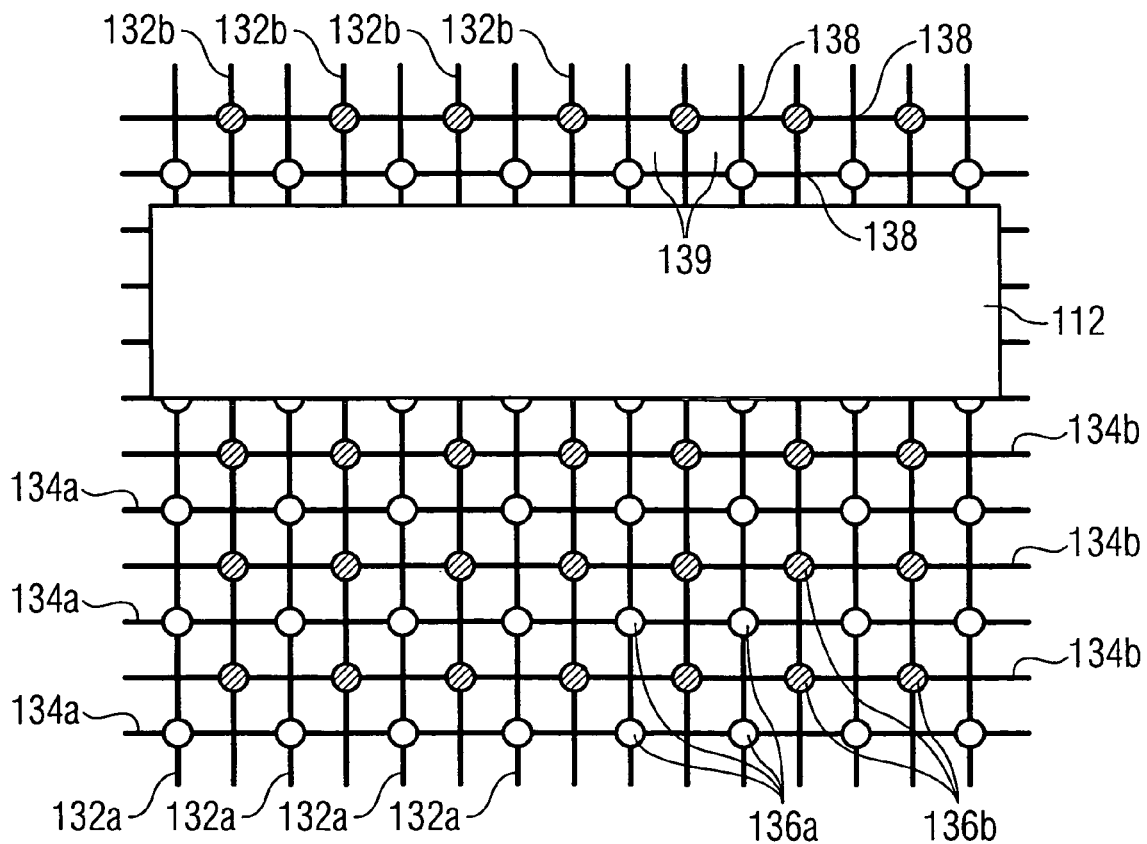
FIG. 2 is a top-view of a circuit board according to a further embodiment of the present invention.

FIG. 2 shows a top-view of a section of the woven plane as described in FIG. 1. For reasons of clarity no dielectric layers are shown in FIG. 2. A part of the first signal trace 112 is shown. As can be seen from FIG. 2, GND lines 132a are alternately arranged to VDD lines 132b. The same is true for the right-angled arranged GND and VDD lines 134a, 134b. GND lines 134a are alternately arranged between VDD lines 134b. GND lines 132a, 134a form a net of GND lines. Corresponding to the GND lines 132a, 134a, the VDD lines 132b, 134b form a net of VDD lines. In each crossing place 136a, 136b, wires belonging to one circuit or net must be connected. Nets belonging to different circuits must be isolated from each other. In FIG. 2 crossing points 136a, 136b of the same lines are marked by a circle. For reasons of clarity only three crossing points 136a, 136b of each net are referenced by the reference signs 136a, 136b. Crossing points 136a are crossing points of GND lines 132a, 134a and crossing points 136b are crossing points of VDD lines 132b, 134b. An electrical connection is provided at the crossing points 136a, 136b of lines of the same net. At crossing points 138 of different lines, the different lines are electrically isolated from each other.

Neighboring lines 132a, 132b, 134a, 134b form plane cells 139. Thus, a plane cell 139 is an area in which no reference voltage is provided. Therefore, the lines 132a, 132b, 134a, 134b are preferably arranged such that the size of each plane cell 139 is smaller than a width of the first signal trace 112. In this embodiment, the width of the signal trace 112 is approximately three and a half times the width of one plane cell 139.

The connections of lines belonging to the same net as well as the isolations between lines belonging to different nets can be realized by using different kinds of varnish for the isolation of GND-wires and VDD-wires. According to an embodiment, the different kinds of varnishes have different melting temperatures.

In a first step, the plane material, i.e., the GND-and VDD-wires, is woven. The wires are isolated from each other by the varnish surrounding the wire.

In a second step, the woven material is subject to a high temperature which is above the melting temperature of the first varnish but below the melting temperature of the second varnish. As a result, the first varnish on the border of, for example, GND-wires will melt and GND-wires will contact each other.

In a third step, the varnish on the GND-wires is fixed. The varnish can be chemically fixed by being polymerized.

In a fourth step the woven material is affected to a high temperature which is above the melting temperature of the second varnish and as a result a varnish on the border of GND-wires will melt and VDD-wires will contact each other. Due to the fixing of the varnish of the GND-wires, the fixed varnish of the GND-wires is not melting again while the varnish of the VDD-wires is melted because the melting temperature of the fixed varnish is higher than the melting temperature of the varnish of VDD-wires.

Both power supply nets have to be connected to corresponding power supply potential. A separate electrical access to the GND or VDD nets can be done by a step of selective chemical etching.

Figure 3:
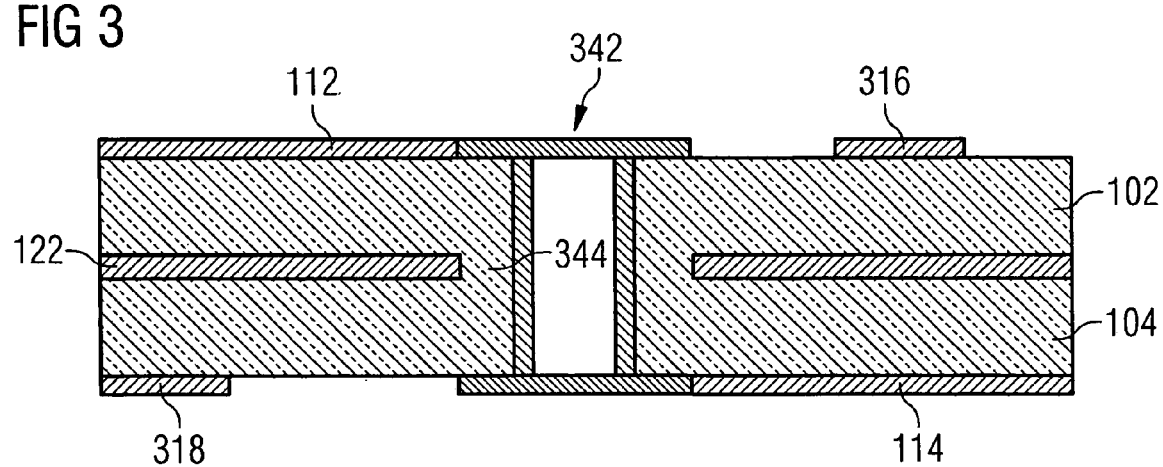
FIG. 3 is a cross-sectional view of a circuit board with a via according to an embodiment of the present invention.
Figure 4:
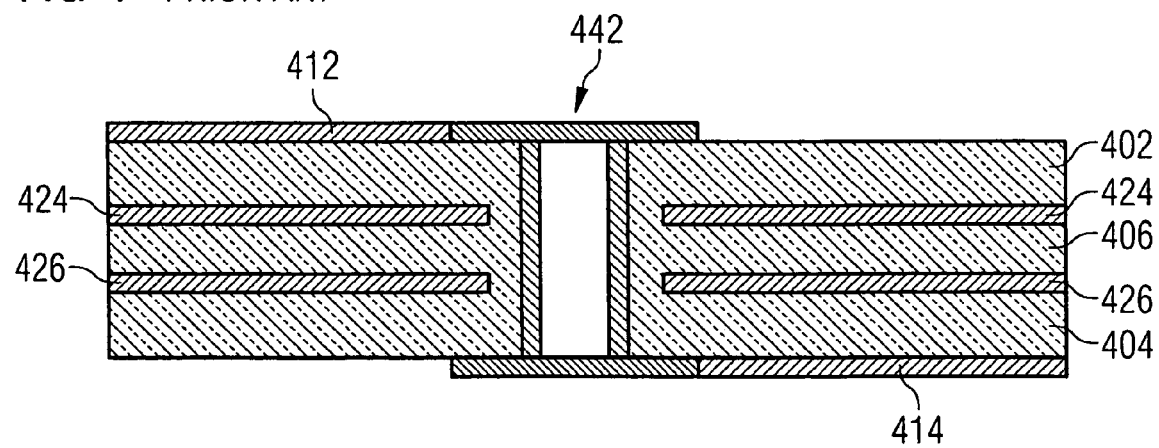
FIG. 4 is a cross-sectional view of a circuit board according to the prior art.

FIG. 3 shows a cross-sectional view of a section of a circuit board with mixed GND/VDD plane according to a further embodiment of the present invention.

The circuit board comprises a first dielectric layer 102 and a second dielectric layer 104. On the top surface of the first dielectric layer 102 a first signal trace 112 is arranged and on the bottom surface of the second dielectric layer 104 a second signal trace 114 is arranged. Between the dielectric layers 102, 104 a mixed GND/VDD plane 122 is arranged. The combined reference plane 122 provides a reference voltage plane for the ground voltage GND as well as for the supply voltage VDD.

On the top surface of the first dielectric layer 102, which forms a first signal layer, a third signal trace 316 is arranged beside the first signal trace 112. On the bottom surface of the second dielectric layer 104, which forms a second signal layer, a fourth signal trace 318 is shown beside the second signal trace 114. The first signal trace 112 is connected to the second signal trace 114 by a via 342 which comprises two planes, each electrically connecting to one of the signal traces 112, 114 and a plated drilled hole which electrically connects the two planes through the dielectric layers 102, 104. The combined reference layer 122 is electrically isolated from the via 342. To this end, the combined reference layer may comprise an opening 344, through which the via 342 passes.

In this embodiment, the first signal trace 112 and the second signal trace 114 are part of a memory data bus which is referenced to the ground voltage. This means that a return current of a data signal propagating on the first signal trace 112 and the second signal trace 114 flows on a ground reference plane. The ground reference plane is part of the combined reference plane 122. Therefore, there is no break in the return current path due to the change from the first signal trace 112 on the first signal layer to the second signal trace 114 on the second signal layer. A return current of a signal propagating on the signal traces 112, 114 can continuously flow through the corresponding supply lines of the combined reference plane 122, even though the signal traces 112, 114 belong to different signal layers.

The third signal trace 316 is part of a memory-address bus. Therefore, a signal propagating on the third signal trace 316 is referenced to the VDD voltage. Nevertheless, the third signal trace 316 can be routed on the same signal layer as the first signal trace 112, which is referenced to the ground voltage because of the combined reference layer 122, which provides a reference plane for the ground voltage and the VDD voltage.

The fourth signal trace 318 can be part of a clock signal path, wherein the clock signal is referenced to the ground voltage which is again provided by the combined reference plane 122.

FIG. 3 shows that a plurality of signal traces for signals being referenced to different reference voltages can be routed on the same signal layer because of a combined reference voltage plane 122 which provides reference voltages for the different signals. Moreover, signal interconnections between different signal layers are possible without a break in the return current path.

According to a further embodiment, the different reference planes are formed by a net of supply lines each. The different nets can be arranged on top of each other such that supply lines of different nets are shifted against each other. The different nets can be isolated from each other by a varnish coating or a thin dielectric layer.

Although the embodiments described above have been described by making reference to GND layers and VDD layers, it is clear that the reference voltages are not limited to these special voltages but can be any kind of supply voltage or reference voltage. Moreover, the present invention is not limited to a combined reference plane providing reference planes for only two reference voltages. By using a plurality of supply lines for different voltages, a combined reference plane can be provided which provides reference voltages for a plurality of different voltages. The net structures are not limited to the structures shown in the embodiment but may have any kind of different net structure and different nets may be interwoven in any kind which is useful for providing a combined reference plane according to the present invention.

The isolation between supply lines of different nets can be realized by varnish or alternatively by any other isolation material. Supply lines of different nets can be separately arranged on a surface of a dielectric layer or alternatively a woven structure of a plurality of supply lines can be produced and afterwards arranged on a dielectric layer. The dielectric layer can be of any kind of material which is useful for circuit boards.

The heating of the supply lines in order to melt the varnish as described in FIG. 2 can be achieved by applying a current to the supply lines or alternatively by any other way of heating the material.

The combined reference plane can be arranged in the middle of a dielectric layer. Such an arrangement provides two signal layers on both surfaces of the dielectric layer in parallel to the combined reference plane. Alternatively the combined reference plane can be arranged on the top or bottom surface of the dielectric layer and on the opposite surface a single signal layer is provided. Moreover, a circuit board can comprise a plurality of combined reference planes with signal layers being arranged adjacent to each combined reference plane.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including

| Reference sign list | |
|---|---|
| 102 | first dielectric layer |
| 104 | second dielectric layer |
| 112 | first signal trace |
| 114 | second signal trace |
| 122 | combined reference voltage plane |
| 132a, 134a | first power supply lines |
| 132b, 134b | second power supply lines |
| 136a, 136b | crossing points of same lines |
| 138 | crossing points of different lines |
| 139 | plane cells |
| 316 | third signal trace |
| 318 | fourth signal trace |
| 342 | via |
| 344 | opening in woven plane |
| 402 | first dielectric layer |
| 404 | second dielectric layer |
| 406 | third dielectric layer |
| 412 | first signal trace |
| 414 | second signal trace |
| 424 | first reference plane |
| 426 | second reference plane |
| 442 | via |

What is claimed is:

1. A circuit board, comprising:
a dielectric layer;
a net of first power supply lines for providing a first reference voltage plane; and
a net of second power supply lines for providing a second reference voltage plane;
wherein the nets of first and second power supply lines are arranged such that first power supply lines and second power supply lines are alternately arranged in the direction of a first surface of the dielectric layer;
wherein the nets of first and second power supply lines are arranged in an interwoven configuration on the first surface of the dielectric layer;
wherein the first and second power supply lines comprise power supply lines extending in a first direction and power supply lines extending in a second direction, wherein a power supply line extending in the first direction is formed to be arranged above a first one of the power supply lines extending in the second direction and below a second one of the power supply lines extending in the second direction;
the circuit board further comprising a first signal trace being arranged on a second surface of the dielectric layer, wherein the second surface is opposite to the first surface of the dielectric layer, wherein a return current from a signal on the first signal trace propagates on the first reference voltage plane.

2. A circuit board according to claim 1, wherein first and second power supply lines are alternately arranged on the first surface of the dielectric layer.

3. A circuit board according to claim 1, wherein the net of first power supply lines is arranged on top of the net of second power supply lines.

4. A circuit board according to claim 1, wherein the interwoven configuration is such that there is an electrical connection at crossing points of lines of the same net and an electrical isolation at crossing points of lines of different nets.

5. A circuit board according to claim 1, wherein a distance between adjacent power supply lines of the first reference voltage plane is smaller than the width of the first signal trace.

6. A circuit board according to claim 1, comprising a second signal trace being arranged on the second surface of the dielectric layer, wherein a return current path of a signal on the second signal trace propagates on the second reference voltage plane.

7. A circuit board according to claim 1, further comprising a second dielectric layer, wherein the first power supply lines and the second power supply lines are arranged between the first dielectric layer and the second dielectric layer.

8. A circuit board according to claim 7, further comprising a third signal trace being arranged on a surface of the second dielectric layer opposite the first and second power supply lines; and
an electric interconnection between the first signal trace and the third signal trace through the first and second dielectric layers, wherein a return current path of a signal on the connected first signal trace and third signal trace propagates on the first reference voltage plane.

9. A circuit board according to claim 1, further comprising a first connection of the first reference voltage plane to a first power supply and a second connection for connecting the second reference voltage to a second power supply, wherein the second power supply is a ground voltage supply.

* * * * *